(12) United States Patent
Totokawa et al.

(10) Patent No.: US 7,458,150 B2
(45) Date of Patent: Dec. 2, 2008

(54) METHOD OF PRODUCING CIRCUIT BOARD

(75) Inventors: Masashi Totokawa, Nagoya (JP);
Yasunori Ninomiya, Kariya (JP)

(73) Assignee: Denso Corporation, Kariya (JP)

( * ) Notice: Subject to any disclaimer, the term of this patent is extended or adjusted under 35 U.S.C. 154(b) by 26 days.

(21) Appl. No.: 11/503,896

(22) Filed: Aug. 14, 2006

(65) Prior Publication Data

US 2007/0074391 A1    Apr. 5, 2007

(30) Foreign Application Priority Data

Aug. 17, 2005   (JP)   ............... 2005-236864

(51) Int. Cl.
*H01K 3/10* (2006.01)

(52) U.S. Cl. ............... 29/852; 29/830; 29/846; 427/96.1; 427/372.2; 427/383.1; 430/311

(58) Field of Classification Search ............. 29/830, 29/846, 852; 427/96.1, 372.2, 383.1; 430/311
See application file for complete search history.

(56) References Cited

U.S. PATENT DOCUMENTS

| 6,099,745 | A | * | 8/2000 | McKenney et al. | ........... 216/13 |
| 6,228,467 | B1 | | 5/2001 | Taniguchi et al. | |
| 6,991,470 | B2 | * | 1/2006 | Muench | ........... 439/55 |
| 2002/0106577 | A1 | * | 8/2002 | Kubota | ........... 430/252 |
| 2006/0057502 | A1 | * | 3/2006 | Okada et al. | ........... 430/313 |
| 2006/0210705 | A1 | * | 9/2006 | Itoh et al. | ........... 427/96.1 |

FOREIGN PATENT DOCUMENTS

JP   2002-299833   10/2002

* cited by examiner

*Primary Examiner*—C. J Arbes
(74) *Attorney, Agent, or Firm*—Harness, Dickey & Pierce, PLC

(57) ABSTRACT

A method of producing a circuit board includes a step of providing a conductive paste including metal nano-particles at an insulating substrate, and a step of sintering the conductive paste so as to form a circuit conductor. In the sintering step, the conductive paste is sintered in a low-oxygen condition including alcohol such that the metal nano-particles are sintered.

20 Claims, 4 Drawing Sheets

FIG. 1A

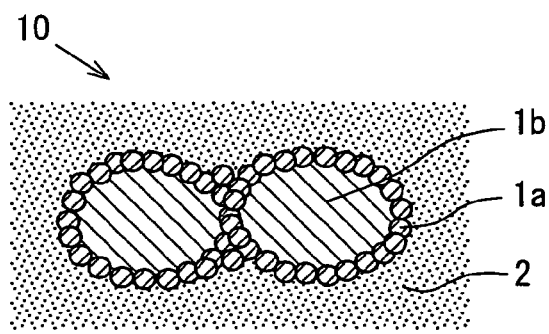

FIG. 1B

|  | METAL NANO-PARTICLE | METAL MICRO-PARTICLE | SOLVENT | PERFORMANCE OF PRINTING (PERFORMANCE FOR FILLING THROUGH-HOLE) |
|---|---|---|---|---|
| COMP. 1 | Ag 40w% | Ag 40w% | Alkane 20w% | GOOD |
| COMP. 2 | Cu 40w% | Cu 40w% | Polyalcohol 20w% | GOOD |
| COMP. 3 | Cu 40w% | Cu 40w% | Alkane 20w% | GOOD |

FIG. 1C

|  | CONDUCTIVE PASTE | CONDITION | RESISTIVITY |
|---|---|---|---|
| EXAMPLE 1 | COMP. 1 | Low-oxygen | 3 $\mu\Omega\cdot$cm |
| EXAMPLE 2 | COMP. 2 | Low-oxygen+(Alcohol) | 3 $\mu\Omega\cdot$cm |
| EXAMPLE 3 | COMP. 3 | Low-oxygen | 30 $\mu\Omega\cdot$cm |
| EXAMPLE 4 | COMP. 1 | Low-oxygen+Alcohol | 3 $\mu\Omega\cdot$cm |
| EXAMPLE 5 | COMP. 2 | Low-oxygen+Alcohol | 3 $\mu\Omega\cdot$cm |
| EXAMPLE 6 | COMP. 3 | Low-oxygen+Alcohol | 3 $\mu\Omega\cdot$cm |

METHOD OF PRODUCING CIRCUIT BOARD

CROSS REFERENCE TO RELATED APPLICATION

This application is based on Japanese Patent Application No. 2005-236864 filed on Aug. 17, 2005, the disclosure of which is incorporated herein by reference in its entirety.

BACKGROUND OF THE INVENTION

1. Field of the Invention

The present invention relates to a method of producing a circuit board, in which a conductive paste in an insulating substrate is sintered to form a circuit conductor.

2. Description of Related Arts U.S. Pat. No. 6,228,467 (corresponding to JP-A-2000-38464) and JP-A-2002-299833 disclose methods for producing a circuit board, especially a multilayer circuit board having a multilayer wiring pattern. In this method, a conductive paste in an insulating substrate is sintered to form a circuit conductor.

FIGS. 4A-4I, 5A and 5B are cross-sectional views showing a method for producing a multilayer circuit board 90 similar to that in the U.S. Pat. No. 6,228,467.

Firstly, as shown in FIG. 4A, a resin film 20 including a thermoplastic resin film 21 and a copper foil 22 is prepared. The resin film 20 is a laminated film with the thermoplastic resin film 21 and the copper foil 22.

Then, as shown in FIG. 4B, a resist coat 23 is formed on the copper foil 22. As shown in FIG. 4C, a mask pattern 23a is formed in a photo process.

Next, as shown in FIG. 4D, an etching of the copper foil 22 is performed by using the mask pattern 23a. Thereafter, as shown in FIG. 4E, the mask pattern 23a is removed so as to form a wiring pattern 22a made of the copper foil 22.

Next, as shown in FIG. 4F, a protecting film 24 is laminated on the other face of the thermoplastic resin film 21.

Next, as shown in FIG. 4G, a laser is irradiated from the opposite face of the wiring pattern 22a so that a based hole H is formed. The wiring pattern 22a is the bottom of the based hole H.

Next, as shown in FIG. 4H, the based hole H is filled with a conductive paste 11 which is a conductive filler made of Ag and Sn. Then, as shown in FIG. 4I, the protecting film 24 is removed. Accordingly, the resin film 20 before a multilayer is prepared.

Next, the resin films 20a-20f are stacked in a direction as shown in FIG. 5A. Next, the stacked resin films 20a-20f are inserted between a pair of thermal pressing boards (not shown), and pressed with heat. An adherence protecting film is provided between the resin films 20a-20f and the thermal pressing boards.

The thermoplastic resin films 21 provided by the resin films 20a-20f are softened by the thermal pressing and integrated, as shown in FIG. 5B. In addition, the conductive paste 11 is heated and sintered to form a connecting conductor, which connects the wiring patterns 22a, so that the multilayer circuit board 90 is produced.

In the above-described conventional method, a photolithography method is used. The photolithography method has many processes and causes an increase in cost for producing the circuit board 90. Moreover, a wet etching is used for the etching of the copper foil 22. The wet etching has many restrictions due to a submerged process in the production of the circuit board 90.

By contrast, in the method for producing the circuit board disclosed in JP-A-2002-299833, a conductive paste including metal particles is used. The diameter of the particles is 1-100 nm on average. A wiring pattern is formed by a screen printing or an ink jet using the conductive paste. The metal particle is sintered at the temperature equal to or less than 250° C. Furthermore, for forming a multilayer wiring pattern, each wiring pattern is build up sequentially.

However, the surfaces of the metal particles used for the conductive paste are easy to be oxidized. Even when the metal particles are sintered at a low temperature, a resistance of the wiring pattern is easy to increase. The multilayer by the build up method has many processes and causes an increase in cost for producing the circuit board.

SUMMARY OF THE INVENTION

In view of the foregoing and other problems, it is an object of the present invention to provide a method for producing a circuit board, in which a conductive paste in an insulating substrate is sintered to form a circuit conductor such that a resistance of a wiring pattern is low.

According to an example of the present invention, a method of producing a circuit board includes a providing process, in which a conductive paste including metal nano-particles is provided at an insulating substrate, and a sintering process, in which the conductive paste is sintered, thereby a circuit conductor is formed. In the sintering process, the conductive paste is sintered in a low oxygen condition including alcohol such that the metal nano-particles are sintered.

Accordingly, the conductive paste including the metal nano-particle can be sintered at the low temperature. Moreover, when the conductive paste is fired under the low-oxygen condition including the alcohol, the alcohol functions as a reducing agent. Thus, a surface oxide film of the metal nano-particle can be removed. That is, an increase in a resistance of the circuit conductor formed by sintering the conductive paste is prevented.

According to an another example of the present invention, a method of manufacturing a circuit board having a multilayer wiring pattern includes a preparing process, in which a plurality of film members each of which has a conductive paste including metal nano-particles filled in through-holes of an insulating substrate are prepared, a stacking process, in which the plurality of film members are stacked, and a heating process, in which the stacked film member is heated in a low oxygen condition including alcohol such that the nano-particles are sintered so as to form the multilayer wiring pattern.

Accordingly, the forming of the multilayer wiring pattern and the sintering of the nano-particles can be performed at one time. Therefore, the manufacturing processes can be decreased extremely compared with conventional methods.

BRIEF DESCRIPTION OF THE DRAWINGS

The above and other objects, features and advantages of the present invention will become more apparent from the following detailed description made with reference to the accompanying drawings. In the drawings:

FIG. 1A is a pattern diagram showing component substances of a conductive paste used in a method of producing a circuit board according to an embodiment of the present invention, FIG. 1B is a diagram showing printing performances including rates of filling through-holes with conductive pastes when the conductive pastes are supplied to insulating substrates by screen printings, and FIG. 1C is a diagram showing resistivities of circuit conductors when the circuit conductors are formed by sintering the conductive pastes in conditions;

DETAILED DESCRIPTION OF PREFERRED EMBODIMENT

Figure 2A:
FIGS. 2A-2C are cross-sectional views showing processes of producing a multilayer circuit board according to the embodiment of the present invention.

FIG. 1A is a pattern diagram showing component substances of a conductive paste 10 used in a method for producing a circuit board according to an embodiment of the present invention.

The conductive paste 10 shown in FIG. 1A includes metal nano-particles 1a whose diameters are nanometer orders. The diameter of the metal nano-particle 1a can be set equal to or less than 50 nm. In this case, the conductive paste 10 can be sintered at a low temperature equal to or less than 300° C., and elaborate wiring patterns and connecting conductors connecting the wiring patterns can be formed.

Further, metal micro-particles 1b are included in the conductive paste 10, as shown in FIG. 1A. The metal micro-particles 1b are made of the same metal as the metal nano-particles 1a, but the diameters of the metal micro-particles 16 are micrometer orders (e.g., several micrometers to tens of micrometers). A mixed material of the metal nano-particles 1a and the metal micro-particles 1b can reduce a cost of the conductive paste 10 and can be used for producing a thick wiring pattern and a connecting conductor having a large diameter. In addition, the rate of the metal nano-particles 1a in the conductive paste 10 can be set equal to or more than 40% by weight. In this case, characteristics by using the metal nano-particles 1a are maintained even when the metal micro-particles 1b are included in the conductive paste 10. The characteristics are that the heating temperature is low and that the elaborate circuit conductor can be produced, for example.

The metal nano-particles 1a and the metal micro-particles 1b can be made of Cu or Ag, which has a high electric conductivity. Especially Cu is better because Cu does not have a tendency of a migration. The conductive paste 10 shown in FIG. 1A includes the metal nano-particles 1a and the metal micro-particles 1b. However, the conductive paste 10 may include the metal nano-particles 1a only.

In the conductive paste 10, metal compositions of the metal nano-particles 1a and the metal micro-particles 1b are dispersed in an appropriate amount of a solvent 2. Alkane solvents or/and alcohol solvents can be used for the solvent 2. The conductive paste 10 can be supplied to an insulating substrate by a variety of methods, e.g., screen printing, which has small processes, thereby the producing cost is low.

When the conductive paste 10 is supplied to the insulating substrate by the screen printing, the performance of the printing is tested. The performance includes the rate of filling a through-hole with the conductive paste 10. The test results are shown in FIG. 1B.

Variety compositions of the conductive paste 10 are tested. In the printing test, the diameters of the metal nano-particles are 5 nm on average and the diameters of the metal micro-particles are 1 μm on average. In a conductive paste of Comp.1 (composition 1), Ag nano-particles 40 wt % and Ag micro-particles 40 wt % are dispersed in an alkane solvent 20 wt %. In a conductive paste of a Comp.2 (composition 2), Cu nano-particles 40 wt % and Cu micro-particles 40 wt % are dispersed in glycerin 20 wt %, which is a polyalcohol solvent. In a conductive paste of a Comp.3 (composition 3), Cu nano-particles 40 wt % and Cu micro-particles 40 wt % are dispersed in an alkane solvent 20 wt %. All the results of the printing tests with the prepared samples of the Comp.1-3 are good by controlling viscosities, e.g., evaporating the solvent. A dripping of the samples is not observed. Also, the performances of the through-hole filling with the samples are good. A void is not caused in the through-hole.

In the method for producing the circuit board according to the embodiment of the present invention, the conductive paste 10 is fired under a low-oxygen condition including alcohol such that the metal nano-particles 1a are sintered. The conductive paste 10 can be sintered at a low temperature because the conductive paste 10 includes the metal nano-particles 1a. In addition, when the conductive paste 10 is fired under the low-oxygen condition including the alcohol, the alcohol functions as a reducing agent. Thus, surface oxide films of the metal nano-particles 1a are removed. Accordingly, an increase in a resistance of the circuit conductor formed by sintering the conductive paste 10 is prevented. The circuit conductor has approximately the same electrical conductivity as that of a metal material in bulk solid.

The conductive pastes 10 of Comp. 1-3 are fired at 300° C. in conditions as described next so that circuit conductors are formed. The results of measuring resistivities of the circuit conductors are shown in FIG. 1C.

Each conductive paste of Comp.1-3 is fired in a low-oxygen condition in Example 1-3 shown in FIG. 1C. In addition, in the Example 2, the solvent 2 of the conductive paste 10 of the Comp.2 is a polyalcohol. Therefore, the conductive paste 10 of the Comp.2 is fired in the condition including the polyalcohol in Example 2. On the other hand, gaseous alcohol is supplied to a low-oxygen chamber in Example 4-6. Each conductive paste of Comp.1-3 is fired in a low-oxygen condition including alcohol in Example 4-6 shown in FIG. 1C.

As shown in Example 1 and Example 4 in FIG. 1C, the resistivities of the circuit conductors are 3 μΩcm, which are made by firing the conductive pastes including the Ag nano-particles. In the conditions both including the alcohol and not including the alcohol, the Ag nano-particles can be sintered favorably.

On the other hand, when the conductive paste including the Cu nano-particles is fired in the condition not including the alcohol, the resistivity of the circuit conductor is 30 μΩcm as shown in Example 3 in FIG. 1C. The surface of the Cu nano-particle in the conductive paste 10 is oxidized in a stationary state so that the Cu nano-particle cannot be sintered by heating only. The resistance of the circuit conductor increases extremely after the Cu nano-particles are sintered, even if the Cu nano-particles can be sintered.

Correspondingly, when the conductive paste 10 including the Cu nano-particles is fired in the condition including the alcohol, the resistivity of the circuit conductor is 3 μΩcm as shown in Example 6 in FIG. 1C. The alcohol functions as a reducing agent so that surface oxide films of the Cu nano-particles can be removed, as mentioned above. Accordingly, the Cu nano-particles can be sintered at the low temperature and the resistance of the circuit conductor can be prevented from increasing after being sintered. The circuit conductor having approximately the same electrical conductivity as that of Cu in bulk solid can be formed. The electrical conductivity of Ag or Cu in bulk solid is 1.6 μΩcm.

Furthermore, the resistivity of the circuit conductor shown in Example 2 in FIG. 1C is 3 μΩcm so that the Cu nano-particles can be sintered favorably. This is because the polyalcohol, which is the solvent 2 of the conductive paste 10 of the Comp. 2, is included in the condition. The gaseous alcohol can be supplied to the chamber, in which the conductive paste 10 is fired. However, the alcohol can be supplied as the solvent 2 of the conductive paste 10. Furthermore, a hydroxyl (—OH) of the alcohol has the function of the reducing agent. Therefore, the polyalcohol having a number of hydroxyls is preferable for the alcohol included in the chamber. The glycerin can be used for the polyalcohol, which is used as the solvent 2 of the Comp.2, for example.

In the method for producing the circuit board according to the present invention, the conductive paste 10 including the metal nano-particles 1a shown in FIG. 1A is fired at the low-oxygen condition including the alcohol as described above. Thus, the circuit board can be produced, in which the resistance of the wiring pattern is low.

The above-described method for producing the circuit board is suitable especially for producing a multilayer circuit board 100 having a multilayer wiring pattern. The method for producing the multilayer circuit board 100 will be described below.

Firstly, as shown in FIG. 2A, a thermoplastic resin film 21 is prepared.

Figure 2B:

Next, as shown in FIG. 2B, a through-hole HA is provided in predetermined positions of the resin film 21 in order to form a connecting conductor between resin films 21. The through-hole HA can be formed not only by laser processing but also by punching.

Figure 2C:
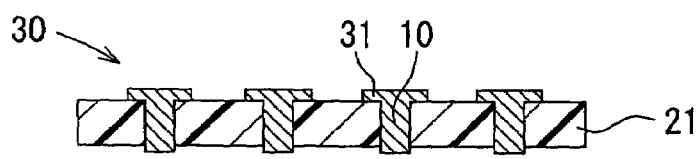

Then, as shown in FIG. 2C, the conductive paste 10 described with reference to FIG. 1A is supplied to the resin film 21 by the screen printing. The through-hole HA is filled with the conductive paste 10 and a wiring pattern 31 is formed on the resin film 21. The conductive paste 10 after printing is dried in a temperature range between a room temperature and 120° C. Accordingly, a resin film 30 before a multilayer is prepared.

Figure 3A:
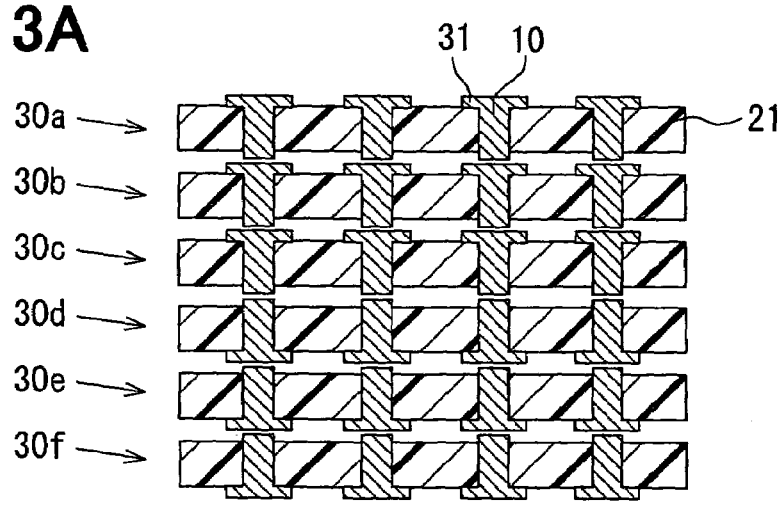
FIGS. 3A and 3B are cross-sectional views showing processes of producing the multilayer circuit board according to the embodiment of the present invention.

Next, the resin films 30a-30f are stacked in a direction and an alignment as shown in FIG. 3A.

Next, the stacked resin films 30a-30f are inserted between a pair of thermal pressing boards (not shown), and pressed with heat at the temperature equal to or less than 300° C. in the above described low-oxygen condition including the alcohol. An adherence protecting film is provided between the resin films 20a-20f and the thermal pressing boards.

Figure 3B:
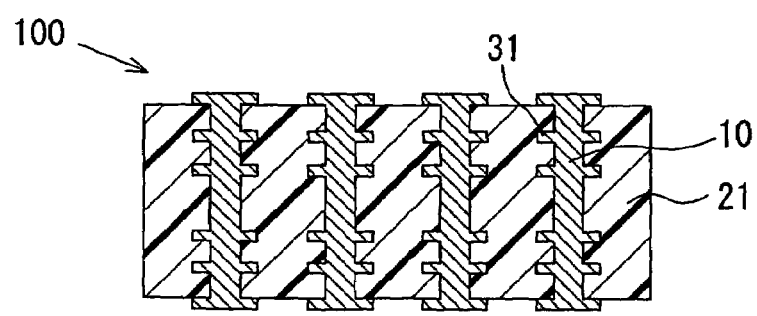
Figure 4A:
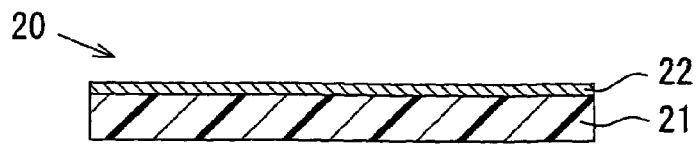
FIGS. 4A-4I are cross-sectional views showing a conventional method of producing a multilayer circuit board.
Figure 4B:
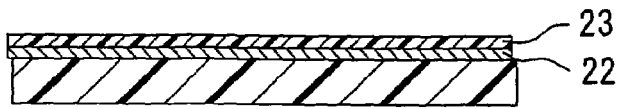
Figure 4C:
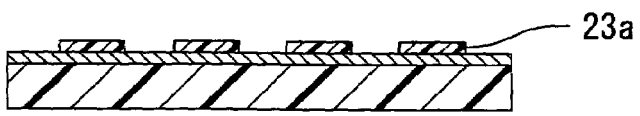
Figure 4D:
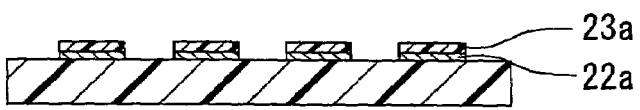
Figure 4E:
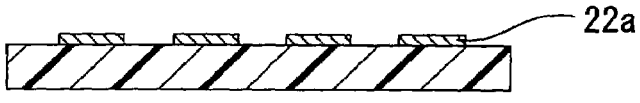
Figure 4F:
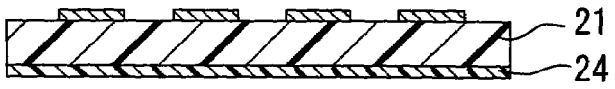
Figure 4G:
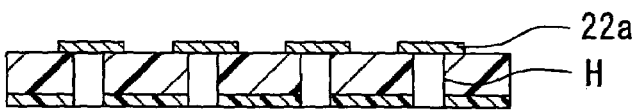
Figure 4H:
Figure 4I:
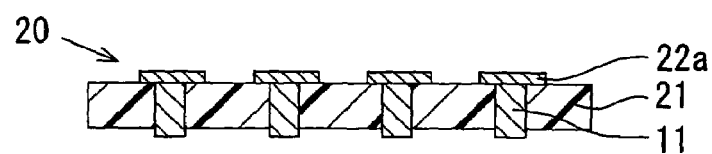
Figure 5A:
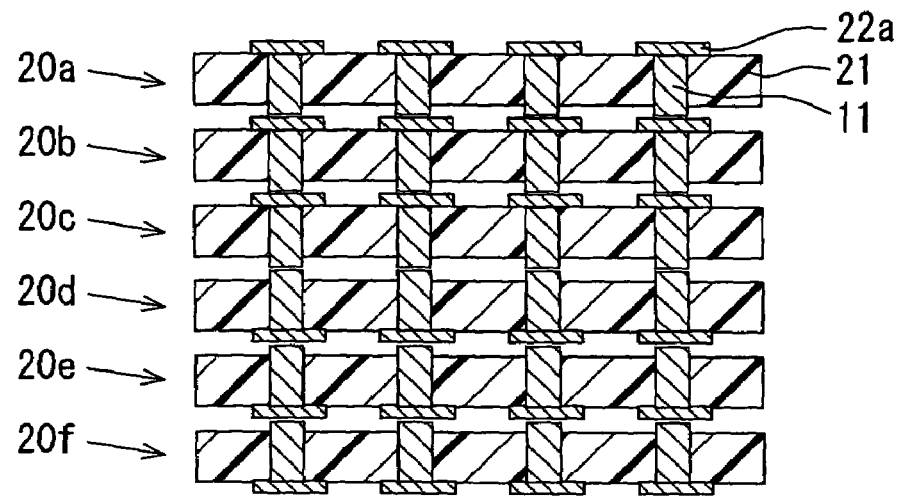
FIGS. 5A and 5B are cross-sectional views showing the conventional method of producing the multilayer circuit board.
Figure 5B:
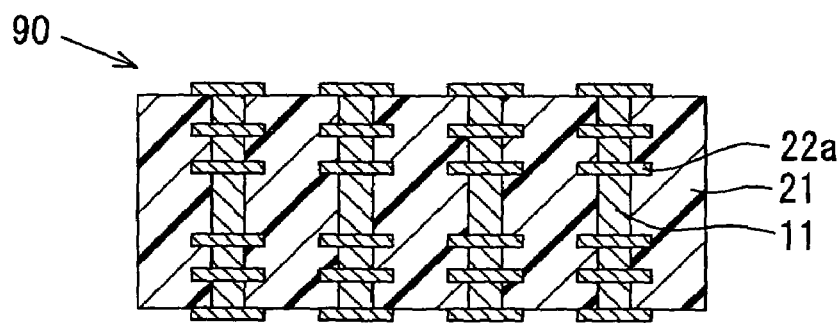

The thermoplastic resin films 21 provided in the resin films 30a-30f are softened by the thermal pressing and integrated as shown in FIG. 3B. In addition, the metal nano-particles 1a in the conductive pastes 10 are sintered at the low-temperature so that a circuit conductor (the wiring pattern 31 and a connecting conductor connecting the wiring patterns 31) is formed.

Accordingly, the multilayer circuit board 100 according to the present invention is produced.

In the method for manufacturing the multilayer circuit board 100 shown in FIGS. 2A-2C, 3A, and 3B, the conductive paste 10 including the metal nano-particles 1a is supplied to the resin film 21 by the screen printing, whose cost is low. The stacked resin films 30a-30f are pressed with heat at the temperature equal to or less than 300° C., which is the allowable temperature limit of the resin film 21. Accordingly, the integration of the resin films 21 and the sintering of the conductive paste 10 can be performed at one time. Therefore, the producing processes can be decreased extremely compared with the conventional methods.

In the above described method for producing the circuit board, in which the conductive paste 10 supplied to the insulating substrate is heated and sintered to form the circuit conductor. Further, the multilayer circuit board 100 including the multilayer wiring pattern 31 with the conductive paste 10 can be produced at a low cost.

Furthermore, the conductive paste 10 including the metal nano-particles 1a may be used in place of the conductive paste 11 in the conventional method for producing the multilayer circuit board 90 shown in FIGS. 4A-4I, 5A, and 5B. The stacked resin films 20a-20f shown in FIG. 5B may be pressed with heat in the low-oxygen condition including the alcohol.

Such changes and modifications are to be understood as being within the scope of the present invention as defined by the appended claims.

What is claimed is:

1. A method of producing a circuit board having a multilayer wiring pattern, the method comprising:
   forming a plurality of thermoplastic resin films, wherein the forming includes a step of forming a through-hole in each of the plurality of thermoplastic resin films, and a step of printing in which a conductive paste including metal nano-particles is supplied to each of the plurality of thermoplastic resin film such that each of the through-holes is filled with the conductive paste and, at the same time a wiring pattern is formed on each of the plurality of thermoplastic resin films;
   stacking the plurality of thermoplastic resin films after the forming step; and
   sintering the plurality of thermoplastic resin films after the stacking step;
   wherein in the sintering, the thermoplastic resin are pressed with heat at a low oxygen condition including alcohol such that the plurality of thermoplastic resin films are integrated and the metal nano-particles of the conductive paste are sintered.

2. The method according to claim 1, wherein:
   a diameter of the metal nano-particles is equal to or less than 50 nm.

3. The method according to claim 1, wherein:
   the conductive paste further includes metal micro-particles, which are made of the same metal as the metal nano-particles.

4. The method according to claim 3, wherein:
   a rate of the metal nano-particles to the conductive paste is equal to or more than 40% by weight.

5. The method according to claim 1, wherein:
   the metal is Cu or Ag.

6. The method according to claim 5, wherein:
   the metal is Cu.

7. The method according to claim 1, wherein:
   the alcohol is a polyalcohol.

8. The method according to claim 7, wherein:
   the polyalcohol is glycerin.

9. The method according to claim 1, wherein:
   the alcohol is supplied as a solvent of the conductive paste.

10. The method according to claim 1, wherein:
    in the step of printing, the conductive paste including the metal nano-particles is supplied to the thermoplastic resin film by a screen printing.

11. A method of producing a circuit board, the method comprising:
    providing a plurality of thermoplastic resin films;
    forming a through-hole in each of the plurality of thermoplastic resin films;
    filling each of the through-holes with a conductive paste including metal nano-particles;

forming a wiring pattern with the conductive paste including metal nano-particles;
stacking the plurality of thermoplastic resin films after the filling and forming steps;
pressing the plurality of the plurality of thermoplastic resin films after the stacking step;
applying heat to the plurality of thermoplastic resin films during the pressing step at a low oxygen condition including alcohol such that the plurality of thermoplastic resin films are integrated and the metal nano-particles are sintered.

12. The method according to claim 11, wherein:
a diameter of the metal nano-particles is equal to or less than 50 nm.

13. The method according to claim 11, wherein:
the conductive paste further includes metal micro-particles, which are made of the same metal as the metal nano-particles.

14. The method according to claim 13, wherein:
a rate of the metal nano-particles to the conductive paste is equal to or more than 40% by weight.

15. The method according to claim 11, wherein:
the metal is Cu or Ag.

16. The method according to claim 15, wherein:
the metal is Cu.

17. The method according to claim 11, wherein:
the applying heat step is performed at a low oxygen condition including alcohol.

18. The method according to claim 17, wherein:
the alcohol is a polyalcohol.

19. The method according to claim 18, wherein:
the polyalcohol is glycerin.

20. The method according to claim 17, wherein:
the alcohol is supplied as a solvent of the conductive paste.

* * * * *